United States Patent
Makita

(10) Patent No.: US 6,696,306 B2
(45) Date of Patent: Feb. 24, 2004

(54) METHODS OF FABRICATING LAYERED STRUCTURE AND SEMICONDUCTOR DEVICE

(75) Inventor: Takehiko Makita, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/400,378

(22) Filed: Apr. 1, 2003

(65) Prior Publication Data

US 2003/0203604 A1 Oct. 30, 2003

(30) Foreign Application Priority Data

| Apr. 26, 2002 | (JP) | ................................. | 2002-127250 |
| Aug. 21, 2002 | (JP) | ................................. | 2002-240971 |
| Mar. 12, 2003 | (JP) | ................................. | 2003-066251 |

(51) Int. Cl.[7] .................... H01L 21/00; H01L 21/335
(52) U.S. Cl. ..................... 438/20; 438/22; 438/47; 438/142; 438/478
(58) Field of Search .................... 438/22, 20, 47, 438/455, 46, 37, 478, 582, 483, 142; 257/96, 190, 200, 183, 94, 11–13, 79, 80, 81, 85

(56) References Cited

U.S. PATENT DOCUMENTS

| 5,679,965 | A | * | 10/1997 | Schetzina | ................... | 257/103 |
| 5,909,036 | A | * | 6/1999 | Tanaka et al. | .............. | 257/94 |
| 6,045,626 | A | * | 4/2000 | Yano et al. | ............. | 148/33.4 |
| 6,046,464 | A | * | 4/2000 | Schetzina | ................... | 257/96 |
| 6,388,275 | B1 | * | 5/2002 | Kano | ......................... | 257/94 |
| 6,420,197 | B1 | * | 7/2002 | Ishida et al. | ................. | 438/22 |
| 6,497,763 | B2 | * | 12/2002 | Kub et al. | ................... | 117/94 |
| 6,534,800 | B1 | * | 3/2003 | Ohbo et al. | ................. | 257/103 |
| 6,589,808 | B2 | * | 7/2003 | Chiyo et al. | ................. | 438/46 |
| 6,610,551 | B1 | * | 8/2003 | Doverspike et al. | ......... | 438/22 |
| 6,617,060 | B2 | * | 9/2003 | Weeks et al. | ............... | 428/698 |

OTHER PUBLICATIONS

Peng, L. H. et al, "Structure Asymmetry Effects in the Optical Gain of Piezostrained InGaN Quantum Wells", IEEE Journal of Selected Topics in Quantum Eelctronics, vol. 5, No. 3, May/Jun. 1999, pp. 1756–1764.*

Robins, L.H. et al, "Optical and Structural studies of compositional inhomgeneity on strain–relaxed indium gallium nitride films", IEEE 2000, pp. 507–512.*

Stacia Keller et al. "Gallium Nitride Based High Power Heterojunction Field Effect Transistor: Process Development and Present Status at UCSB", IEEE Transaction on Electron Devices, vol. 48, No. 3, pp. 552–559, Mar. 2001.

* cited by examiner

*Primary Examiner*—Michael S. Lebentritt
(74) *Attorney, Agent, or Firm*—Volentine Francos, PLLC

(57) ABSTRACT

A method of fabricating a layered structure including a substrate, a first semiconductor layer with a first thermal expansion coefficient $\alpha_A$, and a second semiconductor layer with a second thermal expansion coefficient $\alpha_B$ deposited on the first semiconductor layer, wherein $\alpha_A$ is greater than $\alpha_B$ or smaller than $\alpha_B$, includes: forming the first semiconductor layer, the second semiconductor layer, and a third semiconductor layer with a third thermal expansion coefficient $\alpha_C$ in this order on the substrate at a first temperature using a film deposition technique such as MOCVD, thereby forming a structural body including the substrate and the first to third semiconductor layers, wherein $\alpha_C$ is greater than $\alpha_B$ if $\alpha_A$ is greater than $\alpha_B$ or $\alpha_C$ is smaller than $\alpha_B$ if $\alpha_A$ is smaller than $\alpha_B$; cooling the structural body to a second temperature, which is lower than the first temperature; and removing the third semiconductor layer from the structural body to expose the second semiconductor layer.

19 Claims, 11 Drawing Sheets

METHODS OF FABRICATING LAYERED STRUCTURE AND SEMICONDUCTOR DEVICE

BACKGROUND OF THE INVENTION

The present invention relates to a method of fabricating a layered structure using a film deposition technique such as metal-organic chemical vapor deposition (MOCVD) and a method of fabricating a semiconductor device including the layered structure.

High electron mobility transistors (HEMTs) using a two-dimensional electron gas (2DEG) quantized at a heterojunction interface between different types of compound semiconductor layers are currently used in high-power devices such as microwave devices because they have high performance such as high-speed/high-frequency operating characteristics and low-noise properties. Especially, gallium nitride (GaN) based HEMTs (more specifically, GaN/AlGaN-based HEMTs) having a heterojunction between a GaN channel layer and an n-type $Al_xGa_{1-x}N$ (0<x<1) electron supply layer show a variety of excellent electrical characteristics and are extensively studied.

MOCVD has been widely used for forming a heterojunction by epitaxially growing the compound semiconductor layers on a substrate. MOCVD is a film deposition technique for epitaxially growing a desired crystalline layer by supplying predetermined source gases successively onto a substrate at a predetermined high temperature.

The film deposition technique using MOCVD, however, has the following problems.

Suppose that a crystalline GaN layer and a crystalline $Al_xGa_{1-x}N$ (0<x<1) layer are successively grown on a substrate to form a layered structure, using MOCVD. When the temperature of the layered structure drops in a cooling step after the crystal growth step, an unwanted internal stress occurs in an exposed surface of the $Al_xGa_{1-x}N$ layer, which results from a difference between thermal expansion coefficients (linear expansion coefficients) of the $Al_xGa_{1-x}N$ layer and the GaN layer.

An inventor associated with this patent application observed atomic force microscopy (AFM) images of the surface of the $Al_xGa_{1-x}N$ layer showing a cracked structure at room temperature after the cooling step, as shown in FIG. 11. The surface of the $Al_xGa_{1-x}N$ layer probably is supposed to take on flat and smooth structure immediately after the crystal growth step and before the cooling step, while it is impossible to carry out the AFM observation under such the condition. FIG. 11 shows an AFM image obtained by scanning an area of 1-μm square of the $Al_xGa_{1-x}N$ layer which was cooled with its surface exposed, at a scanning rate of about 1.2 Hz. White areas 11a in the figure are surfaces that can be in contact with an AFM probe and are used as a reference surface. Black areas 11c in the figure are depressed by about 10 nm with reference to the white areas 11a. Gray areas 11b in the figure are also depressed by less than 10 nm with reference to the white areas 11a, and the depth of the gray areas 11b are shallower than the depth of the black areas 11c. As shown in FIG. 11, the $Al_xGa_{1-x}N$ layer has a very rough surface with a large number of depressed areas. More precisely, the cracks in the surface of the $Al_xGa_{1-x}N$ layer have a depth ranging approximately from 3 nm to 7 nm and a width ranging approximately from 10 nm to 30 nm.

Accordingly, if a gate electrode is disposed on the $Al_xGa_{1-x}N$ layer, as in a GaN-based HEMT, for instance, the uneven contact surface between the $Al_xGa_{1-x}N$ layer and the gate electrode obstructs the normal FET operation, making it impossible to accurately evaluate the electrical characteristics of the device.

In addition, the uneven contact surface weakens the adhesion between the $Al_xGa_{1-x}N$ layer and the gate electrode, raising the fear that the gate electrode is detached.

Reference 1 (Stacia Keller et al. "Gallium Nitride Based High Power Heterojunction Field Effect Transistor: Process Development and Present Status at UCSB", IEEE Transaction on Electron Devices, vol. 48, No. 3, pp. 552–559, March 2001) discloses that the formation of crystal grains leading to the cracked structure in the surface of the $Al_xGa_{1-x}N$ layer shown in FIG. 11 can be suppressed by performing MOCVD for growing the crystalline $Al_xGa_{1-x}N$ layer with a low flow of ammonia ($NH_3$) gas and a high surface mobility of metal species.

However, it is difficult to flatten the surface of the $Al_xGa_{1-x}N$ layer by optimizing the flow rate of ammonia in MOCVD, which has high apparatus dependence.

The flow rate of ammonia disclosed in Reference 1 is not always the optimum value for all MOCVD apparatuses. Moreover, there is a possibility that the optimum value of a flow rate of ammonia may be beyond the controllability of the apparatus. Therefore, it cannot be said that the technique disclosed in Reference 1 is a general flattening method.

SUMMARY OF THE INVENTION

It is an object of the present invention to provide a method of fabricating a layered structure, which enables to flatten the surface of the layered structure formed by growing crystals, and a method of fabricating a semiconductor device including the layered structure.

According to the present invention, a method of fabricating a layered structure including a substrate, a first semiconductor layer with a first thermal expansion coefficient $\alpha_A$, and a second semiconductor layer with a second thermal expansion coefficient $\alpha_B$, deposited on the first semiconductor layer, wherein $\alpha_A$ is greater than $\alpha_B$ or smaller than $\alpha_B$, includes: forming the first semiconductor layer, the second semiconductor layer, and a third semiconductor layer with a third thermal expansion coefficient $\alpha_C$ in this order on the substrate at a first temperature using a film deposition technique, thereby forming a structural body including the substrate and the first to third semiconductor layers, wherein $\alpha_C$ is greater than $\alpha_B$ if $\alpha_A$ is greater than $\alpha_B$ or $\alpha_C$ is smaller than $\alpha_B$ if $\alpha_A$ is smaller than $\alpha_B$; cooling the structural body to a second temperature, which is lower than the first temperature; and removing the third semiconductor layer from the structural body to expose the second semiconductor layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A, 3B, and 3C are cross sectional views showing steps subsequent to the step of FIG. 1C, in the fabrication method in accordance with the first and second embodiments, wherein FIG. 3A shows a step in the fabrication method in accordance with the third embodiment;

DETAILED DESCRIPTION OF THE INVENTION

Figure 1A:
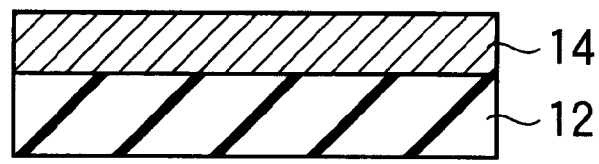
FIGS. 1A, 1B, and 1C are cross sectional views showing steps in a fabrication method in accordance with first, second and third embodiments of the present invention.

Embodiments of the present invention will be described with reference to the attached drawings. The drawings include cross sectional views of layered structures or semiconductor devices fabricated by the fabrication method of the present invention. Those drawings schematically show component geometries, sizes, and positional relationships so that the present invention can be easily understood. Therefore, the present invention is not limited to the examples shown in the drawings. It should be understood that particular materials and conditions disclosed in the following description are preferred examples and that the present invention is not limited to the examples described below. In each drawing, the same or corresponding elements are assigned the same reference character.

First Embodiment

Figure 10:
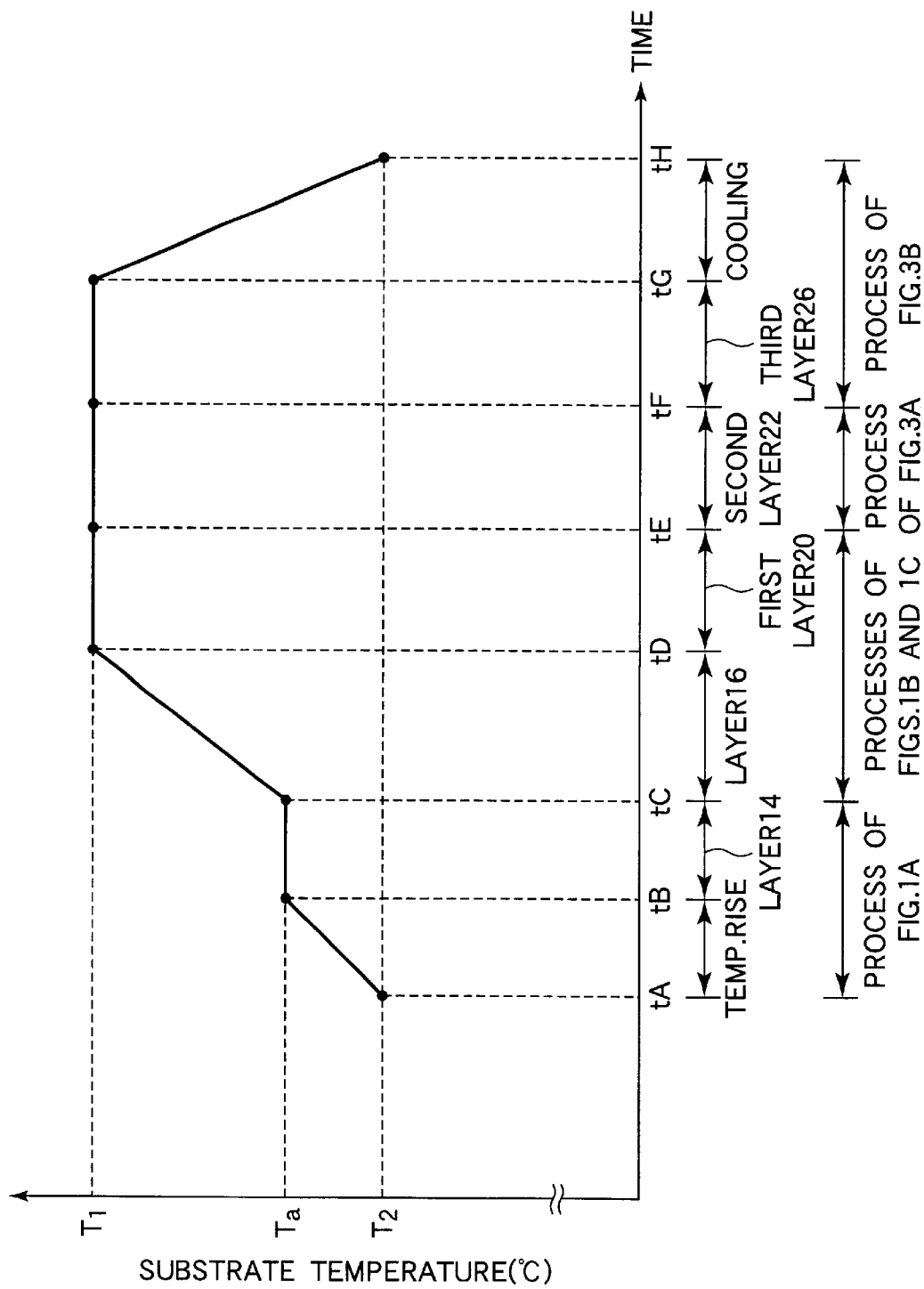
FIG. 10 shows a graph showing changes in substrate temperature (° C.) through the steps in the fabrication method in accordance with the first and second embodiments.
Figure 11:
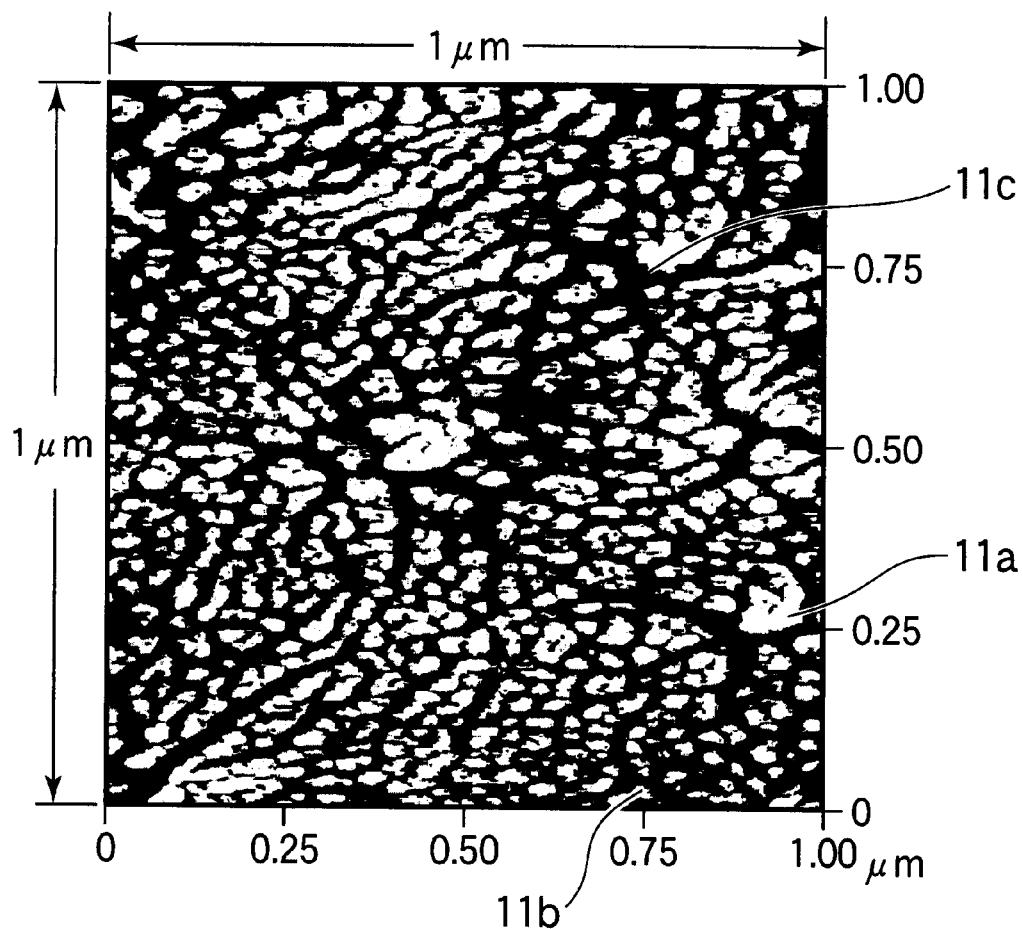
FIG. 11 shows an AFM image of a surface of the conventional $Al_xGa_{1-x}N$ layer.

A method of fabricating a semiconductor device in accordance with a first embodiment of the present invention will now be described with reference to FIGS. 1A–1C, 2A–2B, 3A–3C, 4, 5A–5B and 10. FIG. 10 shows a graph showing changes in substrate temperature (° C.) through the steps in the fabrication method in accordance with the first embodiment.

The first embodiment describes a method of fabricating a GaN-based HEMT, for instance. The layers described below are deposited using a film deposition technique such as MOCVD. In the deposition process, the group-III materials to be supplied are trimethylgallium (Ga $(CH_3)_3$) and trimethylaluminum (Al $(CH_3)_3$), which are metal-organic compounds having an alkyl group, and the group-V material to be supplied is ammonia ($NH_3$), for example.

Figure 1B:
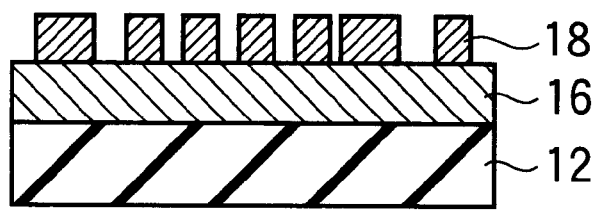
Figure 1C:
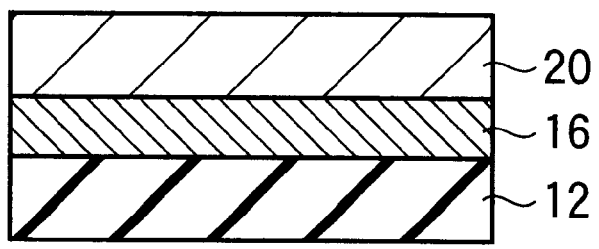
Figure 3A:
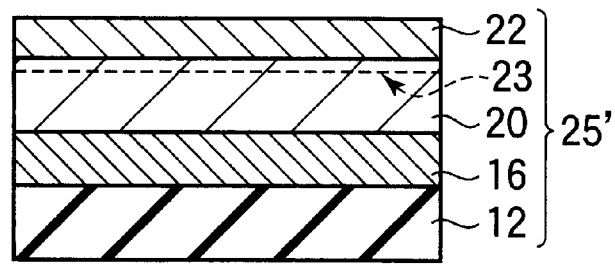
Figure 3B:
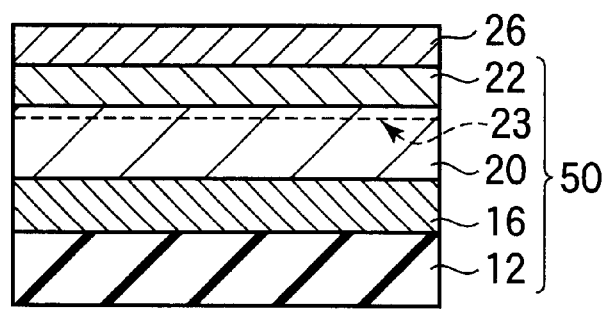

An outline of a method of fabricating the layered structure 25 will be described with reference to FIGS. 1A–1C and 3A–3C. As shown in FIGS. 1A–1C, a GaN buffer layer 16 is formed on a substrate 12. Next, as shown in FIGS. 1C and 3A–3B, a first semiconductor layer 20 with a thermal expansion coefficient $\alpha_A$, a second semiconductor layer 22 with a thermal expansion coefficient $\alpha_B$ and a third semiconductor layer 26 with a thermal expansion coefficient $\alpha_C$ are deposited in this order on the substrate 12 (while putting the GaN buffer layer 16 between the substrate 12 and the first semiconductor layer 20) at a predetermined high temperature $T_1$° C. using MOCVD, thereby forming the structural body 50 including the substrate 12 and the first to third semiconductor layers 20, 22 and 26. The coefficient $\alpha_A$ is greater than $\alpha_B$ or smaller than $\alpha_B$. The coefficient $\alpha_C$ is greater than $\alpha_B$ if $\alpha_A$ is greater than $\alpha_B$ or the coefficient $\alpha_C$ is smaller than $\alpha_B$ if $\alpha_A$ is smaller than $\alpha_B$. Next, the structural body 50 is cooled to a second temperature $T_2$° C., which is lower than the first temperature $T_1$° C. Next, as shown in FIG. 3C, the third semiconductor layer 26 is removed from the structural body 50 to expose the second semiconductor layer 22, thereby forming the layered structure 25.

Next, a detail of the method of fabricating the layered structure 25 will be described with reference to FIGS. 1A–1C, 3A–3C and 10.

Figure 3C:
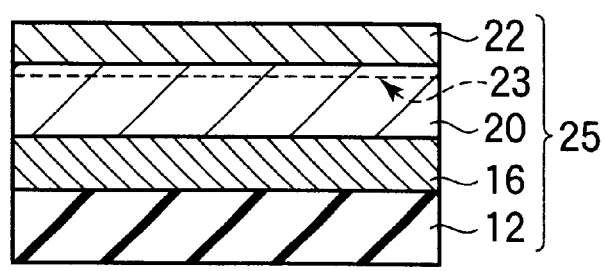

First, a precursor structure 25' shown in FIG. 3A of the layered structure 25 shown in FIG. 3C is formed by depositing a GaN channel layer 20 as the first semiconductor layer, of which thermal expansion coefficient (linear expansion coefficient, in the first embodiment) $\alpha_A$ is $5.4 \times 10^{-6}$/K, and an n-type $Al_{0.2}Ga_{0.8}N$ electron supply layer 22 as the second semiconductor layer, of which thermal expansion coefficient $\alpha_B$ is $5.6 \times 10^{-6}$/K to $5.7 \times 10^{-6}$/K successively on a c-axis oriented sapphire substrate ($Al_2O_3$) 12.

To be more specific, the sapphire substrate 12 is placed in the MOCVD apparatus (a temperature $T_2$° C. in the apparatus ranges from 20° C. to 100° C.) and heated to a temperature $T_a$° C. ranging from 400° C. to 600° C., for instance. Then, a low-temperature amorphous GaN layer (i.e., a low-temperature buffer layer) 14 with a flat surface and a thickness ranging from 10 nm to 50 nm is deposited on the sapphire substrate 12, as shown in FIG. 1A. In FIG. 10, the substrate heating period is from $t_A$ to $t_B$, and the period for depositing the amorphous GaN layer 14 is from $t_B$ to $t_C$.

Then, the sapphire substrate 12 is heated to a temperature ranging from 950° C. to 1150° C. (i.e., a growth temperature $T_1$° C.). In the temperature rise step up to about 1040° C., for instance, the following layers are sequentially grown.

In the temperature rise step up to a growth temperature $T_1$° C. (about 1040° C. in the first embodiment), the amorphous GaN layer 14 is modified to a crystalline GaN buffer layer 16.

To be more specific, in the temperature rise step up to $T_1$° C., the amorphous GaN layer 14 is changed from the substrate side, into a columnar structure having a great number of growing nuclei. While the modification to the columnar structure is occurring, the amorphous GaN layer 14 is being etched by a reactant gas. By increasing the rate of modification to the columnar structure, the GaN buffer layer 16 can be formed uniformly on the surface of the substrate 12. The temperature rise period $t_C$ to $t_D$ up to the growth temperature $T_1$° C. must be long enough to modify the amorphous GaN layer 14 as a low-temperature buffer layer into the crystalline GaN buffer layer 16 having the columnar structure. The temperature rise period $t_C$ to $t_D$ must also be short enough so as to leave a part of the amorphous GaN layer 14 after the amorphous GaN layer 14 has been etched by the reactant gas.

To modify the amorphous GaN layer 14 of 20 nm thick deposited at $T_a=500°$ C., for instance, into the crystalline GaN buffer layer 16 in the temperature rise step up to $T_1=1040°$ C., the optimum temperature rise period is about 7 minutes. However, the optimum temperature rise period depends on the type of the low-temperature buffer layer (GaN or AlN), film thickness, type of gas used for deposition, gas flow rate, specifications of the MOCVD apparatus, and the like. A preferred range of the growth temperature is 950° C. to 1150° C., and a more preferable range is 1000° C. to 1100° C., with which the crystalline GaN buffer layer 16 having better crystal properties can be formed. In FIG. 10, the solid-phase growth period of the crystalline GaN buffer layer 16 is from $t_C$ to $t_D$.

After the temperature reaches $T_1°$ C., a plurality of GaN growing nuclei 18 are formed evenly at a high density on the GaN buffer layer 16 using MOCVD, as shown in FIG. 1B.

Then, at the growth temperature $T_1°$ C., a great number of GaN grain boundaries with slightly different crystallographic orientations are grown again, using the GaN growing nuclei 18 as seeds. The union of adjacent crystal grains and the dislocation of crystal grains take place repeatedly so that a favorable single-crystal (undoped) GaN channel layer 20 with uniform crystallographic orientation and a relatively low number of defects can be formed with a thickness ranging from 2000 nm to 5000 nm, for instance, as shown in FIG. 1C. In FIG. 10, the period for forming the GaN channel layer 20 as the first semiconductor layer is from $t_D$ to $t_E$. In order to obtain the GaN channel layer 20 with favorable crystal properties and a low number of defects, it is preferable that the thickness of the GaN channel layer 20 is 100 nm or greater.

Figure 2A:
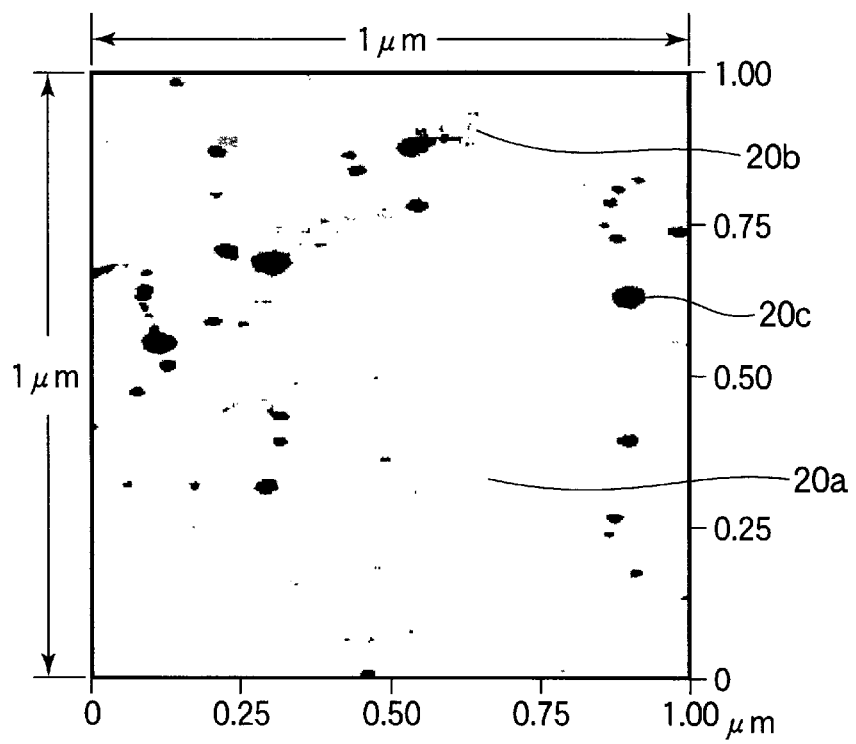
FIG. 2A shows an AFM image of a surface of a GaN channel layer as a first semiconductor layer in the first embodiment.

FIG. 2A shows an AFM image of a surface of the GaN channel layer 20 as the first semiconductor layer obtained through the process described above exhibits uniform crystallographic orientation, or optimized crystal growth conditions. The AFM image of FIG. 2A was obtained by scanning an area of 1-$\mu$m square of the surface of the GaN channel layer 20 (at a scanning rate of about 0.9 Hz). White areas 20$a$ in the figure are surfaces that can be in contact with an AFM probe and are used as a reference surface. Black areas 20$c$ in the figure are depressed by about 10 nm with reference to the white areas 20$a$. Gray areas 20$b$ in the figure are also depressed by less than 10 nm with reference to the white areas 20$a$, and the depth of the gray areas 20$b$ are shallower than the depth of the black areas 20$c$.

FIG. 2A shows that the white areas 20$a$ hold the majority, which means that the surface of the GaN channel layer 20 with optimized crystal growth conditions is very flat, with shallow depressions of which depth ranges approximately from 0.2 nm to 0.4 nm, smaller than the c-axis length of hexagonal GaN (about 0.518 nm). Specifically, the surface of the GaN channel layer 20 actually has pits or depressions at an average density of about $10^{10}/cm^2$.

Next, as shown in FIG. 3A, a crystalline n-type $Al_{0.2}Ga_{0.8}N$ electron supply layer 22 with a thickness ranging from 10 nm to 20 nm is grown on the GaN channel layer 20 by doping $5\times10^{18}$ cm$^{-3}$ of silicon (Si), which is n-type dopant, at the growth temperature $T_1°$ C. In FIG. 10, the period for growing the n-type $Al_{0.2}Ga_{0.8}N$ electron supply layer 22 is from $t_E$ to $t_F$. In the meantime, a 2 DEG 23 is formed at the interface between the GaN channel layer 20 and the n-type $Al_{0.2}Ga_{0.8}N$ electron supply layer 22, due to a difference in band gap. The crystal growth conditions optimized for the GaN channel layer 20 can be used also for the $Al_{0.2}Ga_{0.8}N$ electron supply layer 22, and new optimization is not required.

Now, the precursor structure 25' of the layered structure 25 including the GaN buffer layer 16, the GaN channel layer 20, and the $Al_{0.2}Ga_{0.8}N$ electron supply layer 22 deposited on the sapphire substrate 12 is formed, as shown in FIG. 3A. An undoped $Al_{0.2}Ga_{0.8}N$ spacer layer may be provided at the heterointerface between the GaN channel layer 20 and the n-type $Al_{0.2}Ga_{0.8}N$ electron supply layer 22. If the undoped $Al_{0.2}Ga_{0.8}N$ spacer layer is provided, the electron mobility in the GaN channel layer 20 can be increased further.

In the conventional fabrication method of a GaN-based HEMT, while the precursor structure 25' of the layered structure is cooled to a predetermined temperature, the surface of the n-type $Al_{0.2}Ga_{0.8}N$ electron supply layer 22 is exposed. In the fabrication method in accordance with the present invention, a third semiconductor layer (GaN layer) 26 with a thermal expansion coefficient $\alpha_C$ is deposited on the n-type $Al_{0.2}Ga_{0.8}N$ electron supply layer 22 as the second semiconductor layer before the cooling step. The coefficient $\alpha_C$ of the third semiconductor layer 26 must be greater than the thermal expansion coefficient $\alpha_B$ ($\alpha_C>\alpha_B$) of the second semiconductor layer 22 if the thermal expansion coefficient $\alpha_A$ of the first semiconductor layer 20 is greater than the coefficient $\alpha_B$ ($\alpha_A>\alpha_B$). Further, the coefficient $\alpha_C$ must be smaller than the coefficient $\alpha_B$ ($\alpha_C<\alpha_B$), if the coefficient $\alpha_A$ is smaller than the coefficient $\alpha_B$ ($\alpha_A<\alpha_B$). The growth temperature for the third semiconductor layer 26 is $T_1°$ C., like that for the first and second semiconductor layers 20 and 22.

In the first embodiment, the thermal expansion coefficient $\alpha_A$ of the GaN channel layer 20 as the first semiconductor layer is $5.4\times10^{-6}/K$, and the thermal expansion coefficient $\alpha_B$ of the $Al_{0.2}Ga_{0.8}N$ electron supply layer 22 as the second semiconductor layer 22 is $5.6\times10^{-6}/K$ to $5.7\times10^{-6}/K$. Because the coefficient $\alpha_A$ is smaller than $\alpha_B$ ($\alpha_A<\alpha_B$), the GaN layer 26 having a thermal expansion coefficient of $5.4\times10^{-6}/K$ is provided as the third semiconductor layer of which thermal expansion coefficient $\alpha_C$ is smaller than the thermal expansion coefficient $\alpha_B$ of the second semiconductor layer 22 ($\alpha_C<\alpha_B$). The GaN layer 26 of 10 nm to 20 nm thick is deposited on the n-type $Al_{0.2}Ga_{0.8}N$ electron supply layer 22 to obtain a structural body 50, as shown in FIG. 3B. In FIG. 10, the time period for growing the GaN layer 26 as the third semiconductor layer is from $t_F$ to $t_G$. While the GaN layer 26 is being deposited, the atoms of the GaN layer 26 are repeatedly deposited onto and vaporized from the surface of the GaN layer 26. The third semiconductor layer 26 is not limited to the GaN layer and may be of any other material with thermal expansion coefficient $\alpha_C$ satisfying the condition described above. However, if the third semiconductor layer 26 is made of the same material as the GaN channel layer 20 as the first semiconductor layer, the structure of the MOCVD apparatus can be simplified because the gas used for the GaN channel layer 20 can be used also for growing the crystalline third semiconductor layer 26.

Then, the structural body 50 is cooled down to predetermined temperature $T_2°$ C. ($T_2<T_1$), which ranges from 20° C. to 100° C., for instance.

The structural body 50 is taken out of the MOCVD apparatus after it is left cooled to the temperature $T_2°$ C., for instance. In FIG. 10, the cooling period for the structural body 50 is from $t_G$ to $t_H$. The cooling step may be a natural temperature drop step started by turning off the heater in the MOCVD apparatus immediately after the film is formed, for instance. Depending on the ambient temperature, it can take about one hour to one and a half hours to let the structural body 50 cool to such a level that the structural body 50 can be taken out of the MOCVD apparatus. After the natural cooling step, the GaN layer 26 as the third semiconductor layer has a very flat surface with shallow depressions, of which depth ranges approximately from 0.2 nm to 0.4 nm, smaller than the c-axis length of hexagonal GaN (about 0.518 nm), substantially as shown in FIG. 2A.

The predetermined temperature $T_2°$ C. is not limited to a temperature within the range of 20° C. to 100° C. and may be any temperature at which the GaN layer 26 at the top of the structural body 50 is not degraded, or at which vaporization (re-vaporization in the first embodiment) of atoms from the surface of the GaN layer 26 stops. For instance, the temperature $T_2°$ C. can be a temperature below the growth temperature of the low-temperature GaN buffer layer 16.

Next, the cooled GaN layer 26 as the third semiconductor layer is removed to expose the n-type $Al_{0.2}Ga_{0.8}N$ electron supply layer 22 as the second semiconductor layer.

To be more specific, the GaN layer 26 as the third semiconductor layer is removed at room temperature by dry etching such as inductively coupled plasma reactive ion etching (ICP-RIE) or electron cyclotron resonance ion etching (ECR), using a chlorine ($Cl_2$), boron chloride ($BCl_3$) based gas or argon, which causes relatively little damage to the specimen, as an etching gas, for instance.

Referring to FIG. 3C, in the first embodiment, to remove the GaN layer 26 and to expose the surface of the $Al_{0.2}Ga_{0.8}N$ electron supply layer 22, ICP-RIE is performed using a chlorine-based gas containing hydrogen ($H_2$) and methane ($CH_4$) as etching gases.

Figure 2B:
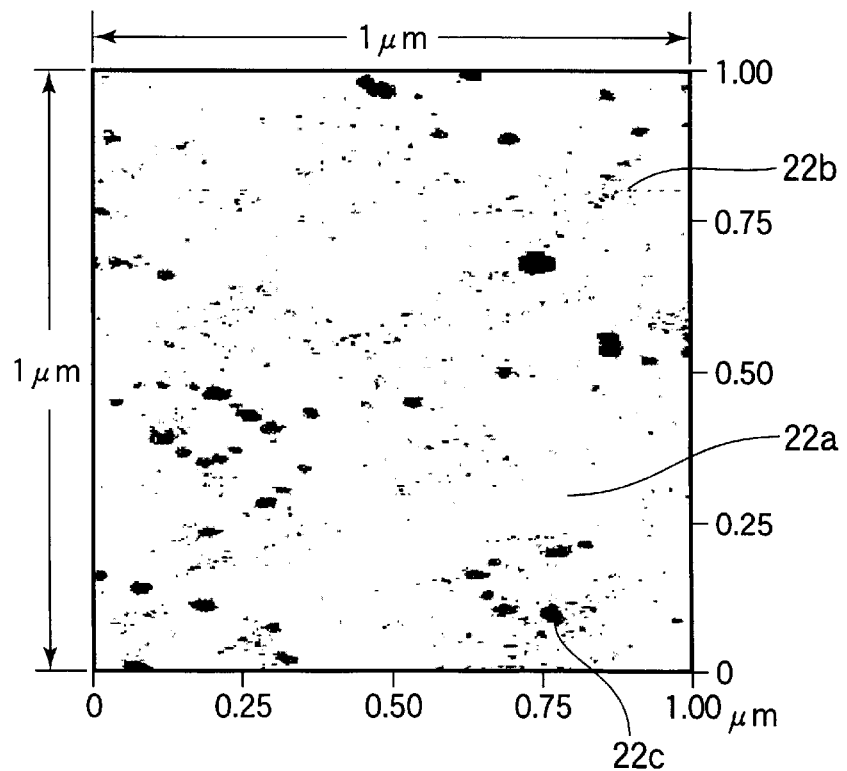
FIG. 2B shows an AFM image of a surface of an $Al_{0.2}Ga_{0.8}N$ layer as a second semiconductor layer after removing a GaN layer as a third semiconductor layer in the first embodiment.

FIG. 2B shows an AFM image of a surface of the $Al_{0.2}Ga_{0.8}N$ electron supply layer 22 exposed by dry etching. Like the image of FIG. 2A, the image of FIG. 2B was obtained by scanning an area of 1-$\mu$m square of the surface (at a scanning rate of about 1.0 Hz). White areas 22a in the figure are surfaces that can be in contact with an AFM probe and are used as a reference surface. Black areas 22c in the figure are depressed by about 10 nm with reference to the white areas 22a. Gray areas 22b in the figure are also depressed by less than 10 nm with reference to the white areas 22a, and the depth of the gray areas 22b are shallower than the depth of the black areas 22c. FIG. 2B shows that the $Al_{0.2}Ga_{0.8}N$ electron supply layer 22 exposed at room temperature has a very flat surface with shallow depressions, of which depth ranges approximately from 0.2 nm to 0.4 nm, smaller than the c-axis length of hexagonal GaN (about 0.518 nm), substantially as shown in FIG. 2A. The surface does not have a cracked structure, which was exhibited in the conventional example.

As described above, a layered structure 25 shown in FIG. 3C can be fabricated with the $Al_{0.2}Ga_{0.8}N$ electron supply layer 22 as the second semiconductor layer having a flat surface.

As the temperature decreases to the room temperature, the GaN layer 26 as the third semiconductor layer relieves (reduces) the internal stress occurring in the $Al_{0.2}Ga_{0.8}N$ electron supply layer 22, which results from the difference of the thermal expansion coefficients between the GaN channel layer 20 and the $Al_{0.2}Ga_{0.8}N$ electron supply layer 22. The $Al_{0.2}Ga_{0.8}N$ electron supply layer 22 may be overetched while the GaN layer 26 is removed by etching, because of small $Al_{0.2}Ga_{0.8}N$/GaN etching selectivity. However, it has been ensured that the overetched surface of the $Al_{0.2}Ga_{0.8}N$ electron supply layer 22 also has favorable flatness.

Then, the layered structure 25 is annealed for about 5 minutes to 20 minutes at 400° C. or higher in an atmosphere of nitrogen ($N_2$) or argon (Ar), in order to remove unwanted etching gas species adsorbed on the surface of the n-type $Al_{0.2}Ga_{0.8}N$ electron supply layer 22.

Figure 4:
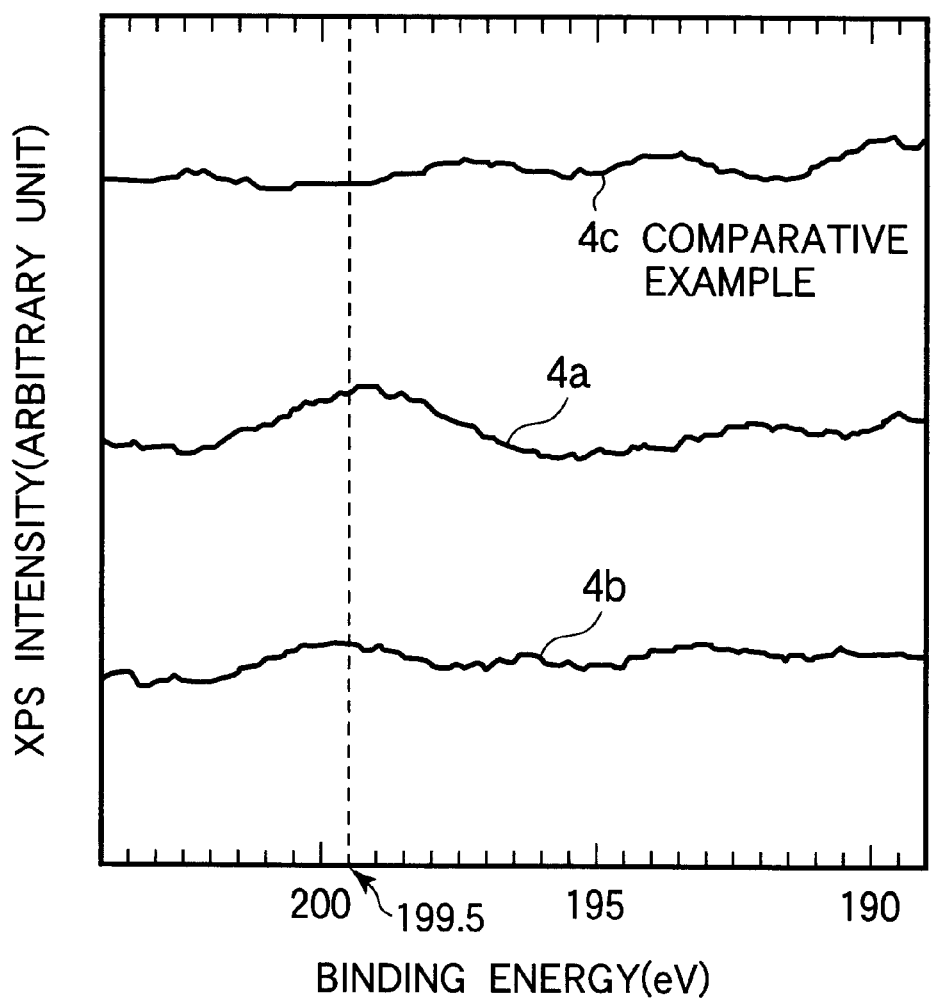
FIG. 4 shows X-ray photoelectron spectroscopy (XPS) spectra obtained from a surface of the $Al_{0.2}Ga_{0.8}N$ layer as a second semiconductor layer in the first embodiment and a surface of an $Al_{0.2}Ga_{0.8}N$ layer of a comparative example.

FIG. 4 shows the results (XPS spectra) obtained from the surface of the $Al_{0.2}Ga_{0.8}N$ electron supply layer 22 under the conditions described later. In FIG. 4, the horizontal axis represents the binding energy (eV), and the vertical axis represents the XPS intensity (arbitrary unit).

A spectrum 4a in FIG. 4 is the XPS spectrum of the surface of the $Al_{0.2}Ga_{0.8}N$ electron supply layer 22 immediately after ICP-RIE (using $BCl_3$ as an etching gas) is performed as described above. A spectrum 4b is the XPS spectrum of the surface of the $Al_{0.2}Ga_{0.8}N$ electron supply layer 22 immediately after annealing is performed as described above. A spectrum 4c provided for comparison is the XPS spectrum of the surface of the $Al_{0.2}Ga_{0.8}N$ layer immediately after it is cleaned by ammonia boil (about 15 minutes at 50° C.) after the $Al_{0.2}Ga_{0.8}N$ layer is formed in the similar manner to FIG. 3A.

The XPS spectrum 4a and XPS spectrum 4b shown in FIG. 4 indicate that the peak belonging to chlorine (Cl) atoms around a binding energy of 199.5 (eV) disappears after annealing, which means that chlorine (Cl) adsorbed on the surface of the n-type $Al_{0.2}Ga_{0.8}N$ electron supply layer 22 has been removed.

Next, the main electrodes of the semiconductor device are formed on the layered structure 25 described above. In the electrode formation step, a control electrode 32, a first main electrode 34, and a second main electrode 36 are formed apart from one another, on the exposed top surface of the n-type $Al_{0.2}Ga_{0.8}N$ electron supply layer 22 as the second semiconductor layer. In the first embodiment, those electrodes 32, 34 and 36 are formed on the top surface of the n-type $Al_{0.2}Ga_{0.8}N$ electron supply layer 22.

To be more specific, a first resist pattern (not shown) for exposing at least one stripe-like part of a predetermined width of the n-type $Al_{0.2}Ga_{0.8}N$ electron supply layer 22, for instance, is formed by photolithography.

Figure 5A:
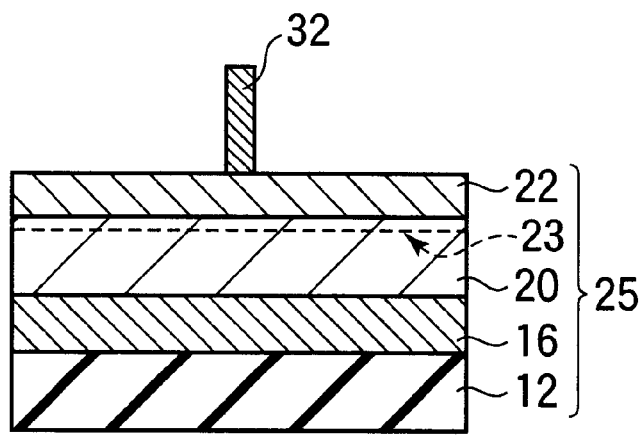
FIGS. 5A and 5B are cross sectional views showing steps subsequent to the step of FIG. 3C, in the fabrication method in accordance with the first embodiment.

The first resist pattern (not shown) is placed as a mask, and a first layered metal for the control electrode (gate electrode) is deposited by successively evaporating nickel (Ni) and gold (Au), for instance, on the first resist pattern (not shown) and the exposed surface of the n-type $Al_{0.2}Ga_{0.8}N$ electron supply layer 22. The evaporation is performed so that a nickel film of 50 nm thick and a gold film of 700 nm thick are formed, for instance. Then, the first resist pattern (not shown) together with the first layered metal deposited thereon is removed by lift-off method, to obtain a stripe-like gate electrode 32 of a predetermined width that is a part of the first layered metal remaining on the n-type $Al_{0.2}Ga_{0.8}N$ electron supply layer 22, as shown in FIG. 5A.

Next, a second resist pattern (not shown) for exposing separate stripe-like parts of a predetermined width of the n-type $Al_{0.2}Ga_{0.8}N$ electron supply layer 22 on both sides of the gate electrode 32, not in contact with the gate electrode 32, is formed, for instance.

Figure 5B:
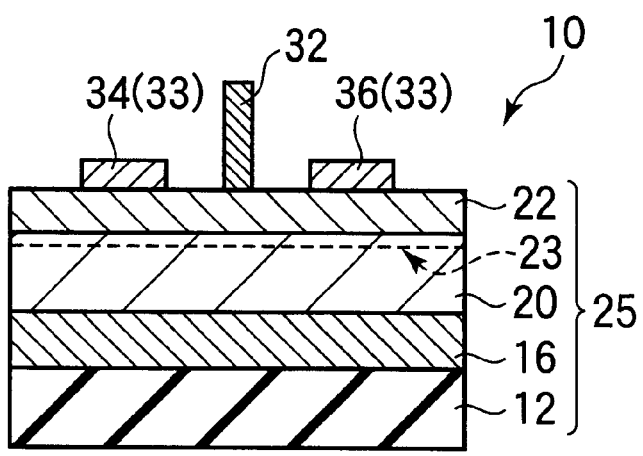

The second resist pattern (not shown) is placed as a mask. A second layered metal 33 for a first main electrode (source electrode) 34 and a second main electrode (drain electrode) 36 is deposited by successively evaporating titanium (Ti), aluminum (Al), and gold (Au), for instance, on the second resist pattern (not shown) and the exposed surface of the n-type $Al_{0.2}Ga_{0.8}N$ electron supply layer 22. The evaporation is performed so that a titanium film of 15 nm thick, an aluminum film of 200 nm thick, and a gold film of 600 nm thick are formed. Then, the second resist pattern (not shown) together with the second layered metal deposited thereon is removed by lift-off method, to obtain stripe-like source electrode 34 and drain electrode 36 having a predetermined width that are parts of the second layered metal 33 remaining on the n-type $Al_{0.2}Ga_{0.8}N$ electron supply layer 22. Now, the GaN-based HEMT 10 is finished, as shown in FIG. 5B.

In the first embodiment, the cooling (temperature drop) step is performed after the $Al_{0.2}Ga_{0.8}N$ electron supply layer 22 is covered with the GaN layer 26 as the third semiconductor layer which has the thermal expansion coefficient $\alpha_C$ satisfying the condition determined by the relationship between the thermal expansion coefficients $\alpha_A$ and $\alpha_B$ of the first semiconductor layer (GaN channel layer 20 in this embodiment) and the second semiconductor layer ($Al_{0.2}Ga_{0.8}N$ layer in this embodiment), as described above.

As a result, an internal stress occurring in the $Al_{0.2}Ga_{0.8}N$ electron supply layer 22 resulting from the difference of the thermal expansion coefficients between the GaN channel layer 20 and the $Al_{0.2}Ga_{0.8}N$ electron supply layer 22 can be relieved by the GaN layer 26 as the third semiconductor layer, in comparison with when the cooling step is performed with the surface of the $Al_{0.2}Ga_{0.8}N$ electron supply layer 22 exposed, as in the conventional art.

The surface of the n-type $Al_{0.2}Ga_{0.8}N$ electron supply layer 22 obtained by removing GaN layer 26 as the third semiconductor layer after the cooling step becomes flatter than that obtained conventionally.

Therefore, the contact condition between the $Al_{0.2}Ga_{0.8}N$ electron supply layer 22 and the electrodes (the gate electrode 32, the source electrode 34, and the drain electrode 36) is improved, and a GaN-based HEMT with better electrical characteristics can be obtained.

Second Embodiment

Figure 6A:
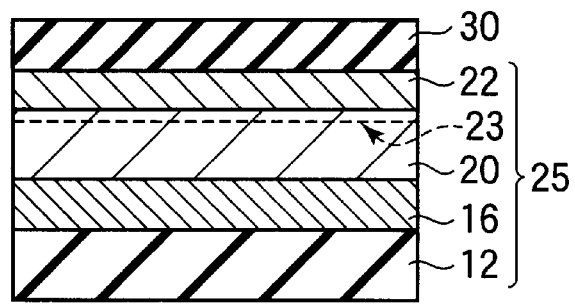
FIGS. 6A, 6B, and 6C are cross sectional views showing steps subsequent to the step of FIG. 3C, in the fabrication method in accordance with the second embodiment.
Figure 6B:
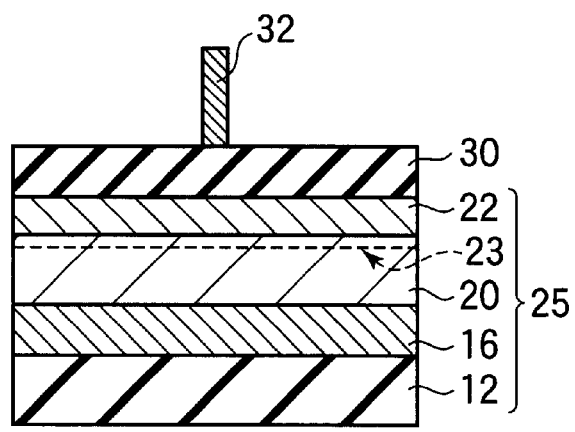
Figure 6C:
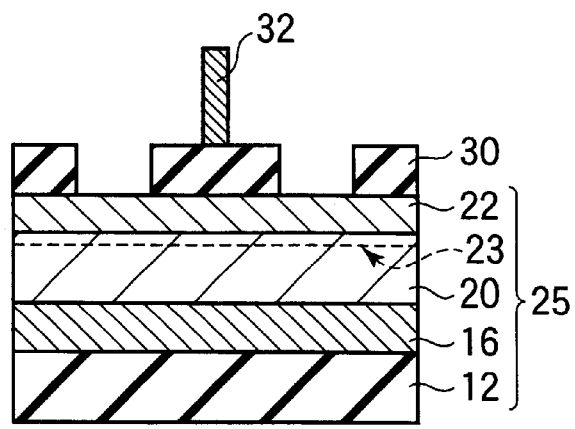
Figure 7:
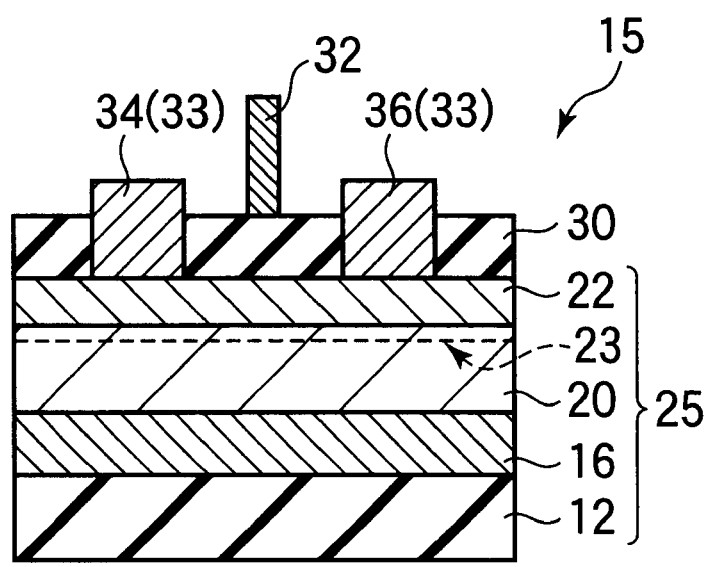
FIG. 7 is a cross sectional view showing a step subsequent to the step of FIG. 6C, in the fabrication method in accordance with the second embodiment.

A method of fabricating a semiconductor device in accordance with a second embodiment of the present invention will now be described with reference to FIGS. 1A–1C, 3A–3C, 6A–6C and 7. FIGS. 6A–6C are cross sectional views showing steps subsequent to the step of FIG. 3C, in the fabrication method in accordance with the second embodiment. FIG. 7 is a cross sectional view showing a step subsequent to the step of FIG. 6C, in the fabrication method in accordance with the second embodiment.

In the same manner as the first embodiment, the layered structure 25 in the second embodiment includes the substrate 12, the GaN buffer layer 16, and the first and second semiconductor layers 20 and 22. The second embodiment differs from the first embodiment in that a metal insulator semiconductor FET (MISFET) having a heterostructure is fabricated by forming a control electrode 32 on an insulating film 30 deposited on the n-type $Al_{0.2}Ga_{0.8}N$ electron supply layer 22 as the second semiconductor layer. This difference will be described in detail.

First, the layered structure 25 shown in FIG. 3C is formed, in the same manner as the first embodiment (FIGS. 1A–1C and 3A–3C) After that, an insulating layer 30 is formed on the exposed $Al_{0.2}Ga_{0.8}N$ electron supply layer 22 as the second semiconductor layer, as shown in FIG. 6A.

To be more specific, an insulating layer 30, which is silicon oxide ($SiO_2$) of 10 nm to 15 nm thick, for instance, is deposited on the exposed n-type $Al_{0.2}Ga_{0.8}N$ electron supply layer 22 as the second semiconductor layer, as shown in FIG. 6A. With those layers, a metal oxide semiconductor FET (MOSFET) is fabricated in the second embodiment. The insulating layer 30 maybe silicon nitride ($Si_3N_4$) or the like instead of silicon oxide. If silicon nitride is used as the insulating layer 30, the film thickness can range from 10 nm to 30 nm.

As in the first embodiment, a stripe-like control electrode as a gate electrode 32 having a predetermined width is formed on the silicon oxide layer 30 as an insulating layer, as shown in FIG. 6B.

Then, the insulating layer 30 is removed from the predetermined areas on both sides of the insulating film sandwiched between the gate electrode 32 and the n-type $Al_{0.2}Ga_{0.8}N$ electron supply layer 22, so that the n-type $Al_{0.2}Ga_{0.8}N$ electron supply layer 22 is exposed in those areas, as shown in FIG. 6C.

To be more specific, as shown in FIG. 6C, the silicon oxide layer 30 covering the n-type $Al_{0.2}Ga_{0.8}N$ electron supply layer 22 is removed by applicable photolithography and etching, from such areas on both sides of the gate electrode 32 that the first and second main electrodes (source electrode 34 and drain electrode 36) will be formed in the subsequent process.

Then, a first main electrode (a source electrode 34, for instance) and a second main electrode (a drain electrode 36, for instance) are formed separately, not in contact with the gate electrode 32, on the areas of the n-type $Al_{0.2}Ga_{0.8}N$ electron supply layer 22 exposed in the insulating layer removal step.

To be more specific, a resist pattern (not shown) for exposing separate stripe-like areas of the n-type $Al_{0.2}Ga_{0.8}N$ electron supply layer 22 is formed, for instance. The resist pattern (not shown) is placed as a mask. The second layered metal 33 is formed on the resist pattern (not shown) and the exposed surface of the n-type $Al_{0.2}Ga_{0.8}N$ electron supply layer 22, as in the first embodiment. Then, the resist pattern (not shown) together with the second layered metal deposited thereon is removed by lift-off method to obtain stripe-like source electrode 34 and drain electrode 36 of a predetermined width that are parts of the second layered metal 33 remaining on the n-type $Al_{0.2}Ga_{0.8}N$ electron supply layer 22. Now, a MOSFET 15 having a heterostructure is finished, as shown in FIG. 7.

In the MOSFET 15, the surface of the layered structure 25 is covered with the silicon oxide layer 30, except for the source electrode 34 and drain electrode 36. Accordingly, the silicon oxide layer 30 can be used as a protection film for the elements, and a MISFET (a MOSFET in the second embodiment) with stable electrical characteristics can be obtained.

The surface of the n-type $Al_{0.2}Ga_{0.8}N$ electron supply layer 22 obtained by removing the GaN layer 26 as the third semiconductor layer after the cooling step becomes flatter than that obtained conventionally, as in the first embodiment.

Therefore, the contact condition between the $Al_{0.2}Ga_{0.8}N$ electron supply layer 22 and the source electrode 34 and drain electrode 36 and between the $Al_{0.2}Ga_{0.8}N$ electron supply layer 22 and the silicon oxide layer 30 as a gate insulating layer is improved, and a MISFET (a MOSFET in the second embodiment) with better electrical characteristics can be obtained.

Third Embodiment

Figure 8A:
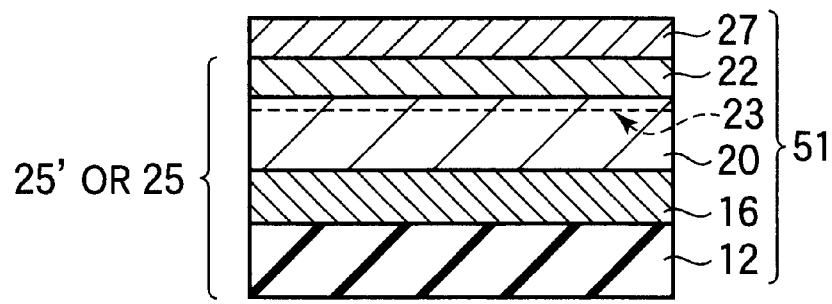
FIGS. 8A, 8B, and 8C are cross sectional views showing steps subsequent to the step of FIG. 3A, in the fabrication method in accordance with the third embodiment.
Figure 8B:
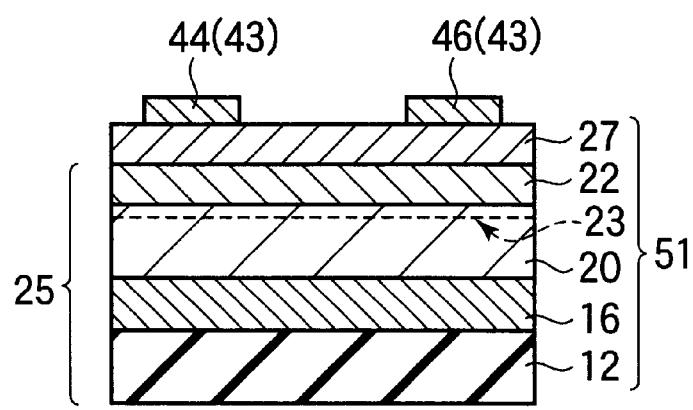
Figure 8C:
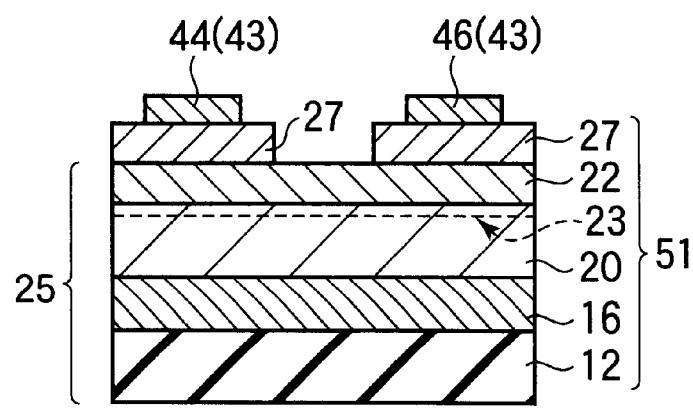
Figure 9:
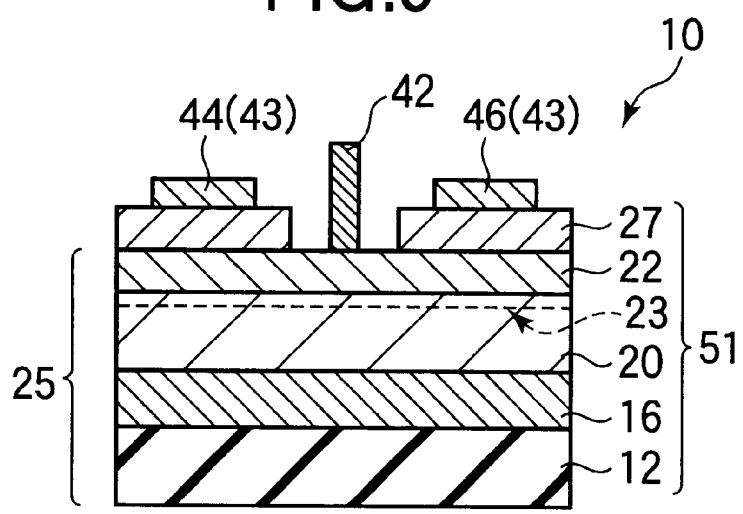
FIG. 9 is a cross sectional view showing a step subsequent to the step of FIG. 8C, in the fabrication method in accordance with the second embodiment.

A method of fabricating a semiconductor device in accordance with a third embodiment of the present invention will now be described with reference to FIGS. 1A–1C, 3A, 8A–8C and 9. FIGS. 8A–8C are cross sectional views showing steps subsequent to the step of FIG. 3A, in the fabrication method in accordance with the third embodiment. FIG. 9 is a cross sectional view showing a step subsequent to the step of FIG. 8C, in the fabrication method in accordance with the third embodiment.

In the same manner as the first embodiment, the precursor structure 25' of the layered structure 25 including the GaN buffer layer 16, the GaN channel layer 20, and the $Al_{0.2}Ga_{0.8}N$ electron supply layer 22 deposited on the sapphire substrate 12 is formed, as shown in FIGS. 1A–1C and 3A. The third embodiment differs from the first embodiment in that some parts of the GaN layer 27 as the third semiconductor layer are left as a contact layer on the n-type $Al_{0.2}Ga_{0.8}N$ electron supply layer 22 as the second semiconductor layer, thereby creating a recessed structure.

The third embodiment differs from the first embodiment in that the crystalline n-type GaN layer 27 is grown as the third semiconductor layer by doping $5 \times 10^{18}$ cm$^{-3}$ of silicon at a temperature $T_1°$ C., as shown in FIG. 8A. Then, the cooling step to the room temperature $T_2°$ C. is carried out, as in the case of the first embodiment.

Before the removal step of the n-type GaN layer 27 as the third semiconductor layer, the first and second main electrodes 44 and 46 formation step is carried out. For instance, a stripe-like first main electrode (a source electrode) 44 and a stripe-like second main electrode (a drain electrode) 46 are formed apart from each other on the n-type GaN layer 27 as the third semiconductor layer. In other words, the first and second main electrodes 44 and 46 are formed on the n-type $Al_{0.2}Ga_{0.8}N$ electron supply layer 22 as the second semiconductor layer via the contact layer 27 as the third semiconductor layer.

To be more specific, a first resist pattern (not shown) as a mask for exposing stripe-like areas of a predetermined width of the n-type GaN layer 27 apart from each other by a predetermined distance is formed, for instance. Then, the second layered metal 43 is deposited on the first resist pattern (not shown) and the exposed surface of the n-type GaN layer 27, in the same way as the first embodiment.

Then, the first resist pattern (not shown) together with the second layered metal deposited thereon is removed by lift-off method to obtain the stripe-like source electrode 44 and drain electrode 46 having a predetermined width that are parts of the second layered metal 43 remaining on the n-type GaN layer 27, as shown in FIG. 8B.

Next, a part of the n-type GaN layer 27 as the third semiconductor layer is removed, leaving the areas on which the source electrode 44 and the drain electrode 46 have been formed apart from each other by a predetermined distance.

To be more specific, a second resist pattern (not shown) for exposing a stripe-like area of a predetermined width of the n-type GaN layer 27 between the source electrode 44 and the drain electrode 46 is formed, for instance. Then, ICP-RIE is performed using the second resist pattern (not shown) as a mask. After a part of the n-type $Al_{0.2}Ga_{0.8}N$ electron supply layer 22 is exposed, leaving some parts of the n-type GaN contact layer 27, the second resist pattern (not shown) is removed, as shown in FIG. 8C.

Then, a third resist pattern (not shown) as a mask for exposing at least one stripe-like area of a predetermined width of the n-type $Al_{0.2}Ga_{0.8}N$ electron supply layer 22 is formed, for instance. Then, the first layered metal is deposited on the third resist pattern (not shown) and the exposed surface of the n-type $Al_{0.2}Ga_{0.8}N$ electron supply layer 22, in the same way as the first embodiment.

Then, the third resist pattern (not shown) together with the first layered metal deposited thereon is removed by lift-off method to obtain a stripe-like gate electrode 42 of a predetermined width that is a part of the first layered metal remaining on the $Al_{0.2}Ga_{0.8}N$ electron supply layer 22. Now, the GaN-based HEMT 10 with a recessed structure is finished, as shown in FIG. 9.

The gate electrode 42 is formed after the source electrode 44 and the drain electrode 46 are formed, in the third embodiment. However, the source electrode 44 and the drain electrode 46 may be formed after the gate electrode 42 is formed. The source electrode 44 and the drain electrode 46 are usually annealed after forming these electrodes. If the gate electrode 42 is formed later, as in the third embodiment, the gate electrode 42 is not affected by annealing, and a good Schottky contact can be obtained.

As has been described above, the GaN-based HEMT fabricated in the third embodiment has the same effects as that in the first embodiment.

Moreover, the device fabricated in the third embodiment provides a better contact between the $Al_{0.2}Ga_{0.8}N$ electron supply layer 22 and the source and drain electrodes 44, 46 via the n-type GaN contact layer 27, and has a recessed structure with the gate electrode 42. Therefore, the resistance of the ohmic contact between the n-type GaN contact layer 27 and the source electrode 44 and drain electrode 46 can be reduced, and a GaN-based HEMT with further favorable electrical characteristics can be obtained.

The present invention is not limited to the example described in the first to third embodiments. The present invention can be modified by using appropriate other conditions. For instance, the semiconductor device to which the present invention is applied is not limited to the HEMT described above and may be other devices such as a heterostructure FET (HFET) and a MISFET.

The structure has the second semiconductor layer, which must be deposited flat, as the topmost layer. However, the present invention can be applied also to a structure having the second semiconductor layer as a layer interface.

The sapphire substrate used in the first to third embodiments may be replaced by a silicon carbide (SiC) substrate or the like. If the silicon carbide substrate is used as the substrate 12, a buffer layer formed of aluminum nitride (AlN) would be preferred.

The composition ratio of the second semiconductor layer 22 is not limited to $Al_{0.2}Ga_{0.8}N$, as in the first to third embodiments, and may be set appropriately for the purpose and design.

As has been described above, an internal stress occurring in the second semiconductor layer 22 due to a difference in thermal expansion coefficient between the first and second semiconductor layers 20 and 22 can be relieved by covering the second semiconductor layer 22 with the third semiconductor layer 26 or 27, in comparison with when the cooling step is performed with the surface of the second semiconductor layer 33 exposed, as in the conventional art.

As a result, the surface of the second semiconductor layer 22 obtained by removing the third semiconductor layer 26 or 27 becomes flatter than that obtained conventionally. Accordingly, a favorable semiconductor device can be obtained, without fear of degrading the electrical characteristics owing to the surface roughness of the second semiconductor layer 22.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of fabricating a layered structure including a substrate, a first semiconductor layer with a first thermal expansion coefficient $\alpha_A$, and a second semiconductor layer with a second thermal expansion coefficient $\alpha_B$ deposited on the first semiconductor layer, wherein $\alpha_A$ is greater than $\alpha_B$ or smaller than $\alpha_B$, said method comprising:

forming the first semiconductor layer, the second semiconductor layer, and a third semiconductor layer with a third thermal expansion coefficient $\alpha_C$ in this order on a substrate at a first temperature using a film deposition technique, thereby forming a structural body including the substrate and the first to third semiconductor layers, wherein $\alpha_C$ is greater than $\alpha_B$ if $\alpha_A$ is greater than $\alpha_B$ or $\alpha_C$ is smaller than $\alpha_B$ if $\alpha_A$ is smaller than $\alpha_B$;

cooling the structural body to a second temperature, which is lower than the first temperature; and removing the third semiconductor layer from the structural body to expos e the second semiconductor layer.

2. The method according to claim 1, wherein the film deposition technique is metal-organic chemical vapor deposition.

3. The method according to claim 1, further comprising:
forming a buffer layer o n the substrate before said forming step of the first semiconductor layer so that the first semiconductor layer is formed on the buffer layer.

4. The method according to claim 1, wherein the third semiconductor layer is made of the same material as the first semiconductor layer.

5. The method according to claim 1, wherein the first semiconductor layer and the third semiconductor layer are made of GaN, and the second semiconductor layer is made of $Al_xGa_{1-x}N$, where $0<x<1$.

6. The method according to claim 5, wherein the first temperature is within a range of 950° C. to 1150° C. inclusive.

7. The method according to claim 1, wherein the second temperature is a temperature at which vaporization of atoms of the third semiconductor layer from a surface of the third semiconductor layer stops.

8. The method according to claim 1, wherein said removing step of the third semiconductor layer is performed using dry etching.

9. A method of fabricating a semiconductor device including a layered structure, which includes a substrate, a first semiconductor layer with a first thermal expansion coefficient $\alpha_A$, and a second semiconductor layer with a second thermal expansion coefficient $\alpha_B$ deposited on the first semiconductor layer, wherein $\alpha_A$ is greater than $\alpha_B$ or smaller than $\alpha_B$, said method comprising:

forming the first semiconductor layer, the second semiconductor layer, and a third semiconductor layer with a third thermal expansion coefficient $\alpha_C$ in this order on the substrate at a first temperature using a film deposition technique, thereby forming a structural body including the substrate and the first to third semiconductor layers, wherein $\alpha_C$ is greater than $\alpha_B$ if $\alpha_A$ is greater than $\alpha_B$ or $\alpha_C$ is smaller than $\alpha_B$ if $\alpha_A$ is smaller than $\alpha_B$;

cooling the structural body to a second temperature, which is lower than the first temperature; and removing the third semiconductor layer from the structural body to expose the second semiconductor layer.

10. The method according to claim 9, wherein the film deposition technique is metal-organic chemical vapor deposition.

11. The method according to claim 9, further comprising:
forming a buffer layer on the substrate before said forming step of the first semiconductor layer so that the first semiconductor layer is formed on the buffer layer.

12. The method according to claim 9, wherein the third semiconductor layer is made of the same material as the first semiconductor layer.

13. The method according to claim 9, wherein the first semiconductor layer and the third semiconductor layer are made of GaN, and the second semiconductor layer is made of $Al_xGa_{1-x}N$, where $0<x<1$.

14. The method according to claim 13, wherein the first temperature is within a range of 950° C. to 1150° C. inclusive.

15. The method according to claim 9, wherein the second temperature is a temperature at which vaporization of atoms of the third semiconductor layer from a surface of the third semiconductor layer stops.

16. The method according to claim 9, wherein said removing step of the third semiconductor layer is performed using dry etching.

17. The method according to claim 9, further comprising:
forming a control electrode, a first main electrode, and a second main electrode on the exposed surface of the second semiconductor layer.

18. The method according to claim 9, further comprising:
forming an insulating layer on the exposed surface of the second semiconductor layer;
forming a control electrode on the insulating layer;
removing a part of the insulating layer to expose a part of the second semiconductor layer; and
forming a first main electrode and a second main electrode on the exposed surface of the second semiconductor layer.

19. The method according to claim 9, wherein said removing step of the third semiconductor layer is performed so as to remove a part of the third semiconductor layer;
said method further comprising:
forming a first main electrode and a second main electrode on the third semiconductor layer before said removing step of the third semiconductor layer; and
forming a control electrode on the exposed surface of the second semiconductor layer after said removing step of the third semiconductor layer.

* * * * *